(12) United States Patent
Oda

(10) Patent No.: US 11,683,032 B2
(45) Date of Patent: Jun. 20, 2023

(54) POWER SEMICONDUCTOR DEVICE

(71) Applicant: Mitsubishi Electric Corporation, Tokyo (JP)

(72) Inventor: Hisashi Oda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/682,227

(22) Filed: Feb. 28, 2022

(65) Prior Publication Data
US 2022/0385285 A1    Dec. 1, 2022

(30) Foreign Application Priority Data

May 31, 2021    (JP) .................................. 2021-091366

(51) Int. Cl.
| | | |
|---|---|---|
| *H03K 17/567* | (2006.01) | |
| *H02M 1/00* | (2006.01) | |
| *H02M 1/088* | (2006.01) | |

(52) U.S. Cl.
CPC ........ *H03K 17/567* (2013.01); *H02M 1/0006* (2021.05); *H02M 1/088* (2013.01)

(58) Field of Classification Search
CPC ... H03K 17/567; H02M 1/0006; H02M 1/088
See application file for complete search history.

(56) References Cited

U.S. PATENT DOCUMENTS 10,116,213 B2 * 10/2018 Shimizu .............. H01L 29/7393
2020/0381913 A1 * 12/2020 Harada .................... H01F 7/064

FOREIGN PATENT DOCUMENTS

| JP | 2018-068097 A | 4/2018 |
| JP | 2019-213430 A | 12/2019 |
| JP | 2020-141550 A | 9/2020 |

* cited by examiner

*Primary Examiner* — Metasebia T Retebo
(74) *Attorney, Agent, or Firm* — Studebaker & Brackett PC

(57) ABSTRACT

A power semiconductor device of the present disclosure includes: a first switching element; a second switching element connected in parallel to the first switching element, and having a higher short circuit capability than the first switching element; drive circuits to drive the first switching element and the second switching element; and determination circuits to compare a target current as a sum of a current flowing through the first switching element and a current flowing through the second switching element to a first threshold and a second threshold greater than the first threshold. The drive circuits switch off the first switching element when the determination circuits determine that the target current is equal to or greater than the first threshold, and switch off the second switching element when the determination circuits determine that the target current is equal to or greater than the second threshold.

5 Claims, 5 Drawing Sheets

POWER SEMICONDUCTOR DEVICE

BACKGROUND OF THE INVENTION

Field of the Invention

The present disclosure relates to power semiconductor devices.

Description of the Background Art

Japanese Patent Application Laid-Open No. 2020-141550 discloses a drive device to drive a Si-IGBT and a SiC-MOSFET connected in parallel. The Si-IGBT is an insulated gate bipolar transistor (IGBT) in which Si is used as a semiconductor material. The SiC-MOSFET is a metal oxide semiconductor field effect transistor (MOSFET) in which SiC is used as a semiconductor material. When an excessive current flows through the Si-IGBT or the SiC-MOSFET, the drive device disclosed in Japanese Patent Application Laid-Open No. 2020-141550 switches off the SiC-MOSFET having a lower short circuit capability first to protect the SiC-MOSFET.

The drive device disclosed in Japanese Patent Application Laid-Open No. 2020-141550 switches off the Si-IGBT after switching off the SiC-MOSFET. The short circuit capability of a power semiconductor device is thus limited by the SiC-MOSFET having a lower capability.

SUMMARY

It is an object of technology of the present disclosure to reduce loss and improve the short circuit capability of a power semiconductor device.

A power semiconductor device of the present disclosure includes a first switching element, a second switching element, a drive circuit, and a determination circuit. The second switching element is connected in parallel to the first switching element, and has a higher short circuit capability than the first switching element. The drive circuit drives the first switching element and the second switching element. The determination circuit compares a target current as a sum of a current flowing through the first switching element and a current flowing through the second switching element to a first threshold and a second threshold greater than the first threshold. The drive circuit switches off the first switching element when the determination circuit determines that the target current is equal to or greater than the first threshold, and switches off the second switching element when the determination circuit determines that the target current is equal to or greater than the second threshold.

According to the power semiconductor device of the present disclosure, by properly setting the first threshold and the second threshold, only the first switching element can be shut down when a short circuit current flows. As a result, the short circuit capability of the power semiconductor device as a whole can be determined by the second switching element while destruction of the first switching element having a lower short circuit capability is prevented. As a result, the short circuit capability of the power semiconductor device as a whole can easily be designed to be high.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Embodiment 1

A-1. Configuration

Figure 1:
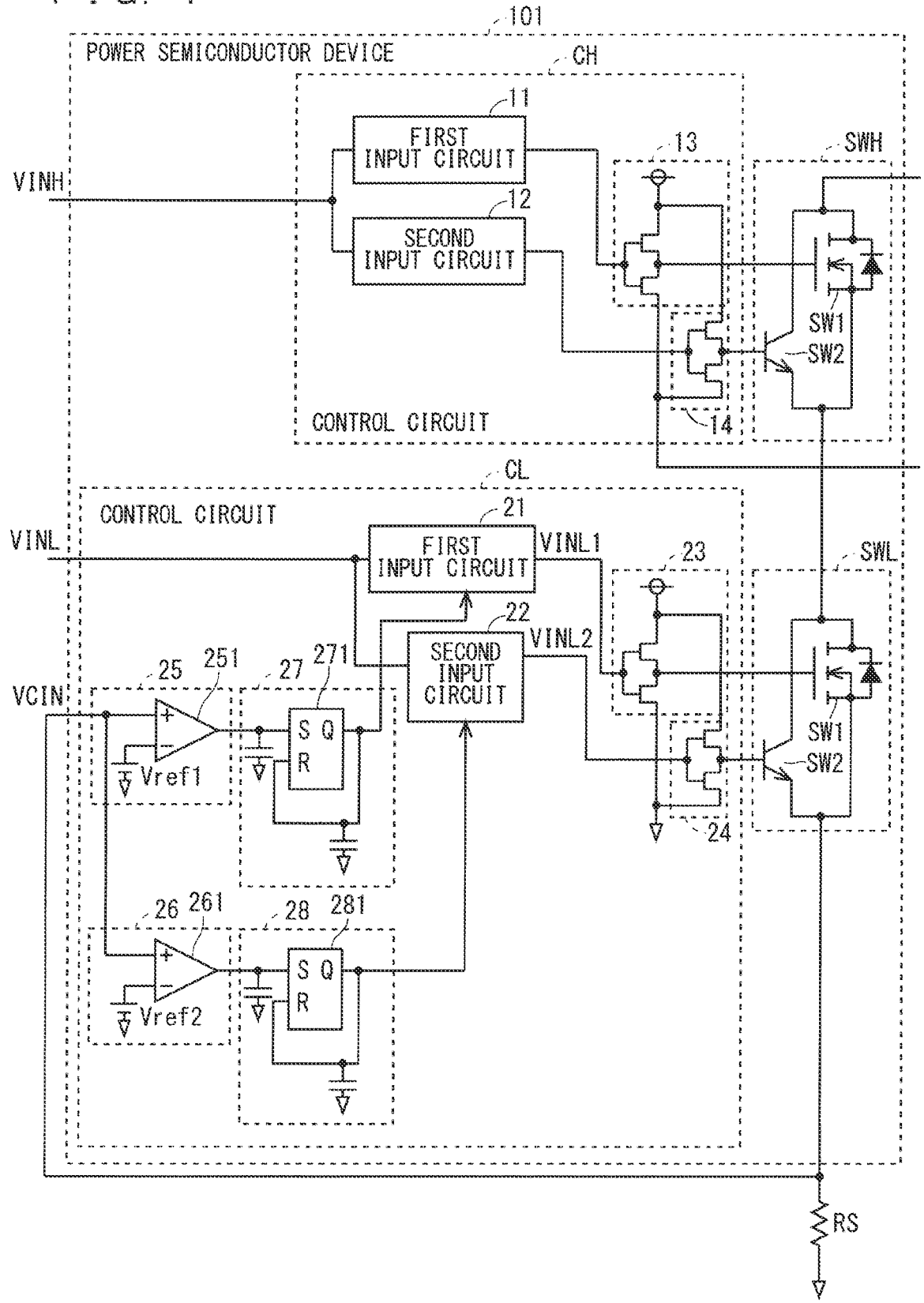
FIG. 1 shows a configuration of a power semiconductor device in Embodiment 1.

FIG. 1 shows a configuration of a power semiconductor device 101 in Embodiment 1. The power semiconductor device 101 includes switching units SWH and SWL and control circuits CH and CL. The switching unit SWH forms an upper arm. The switching unit SWL forms a lower arm. The control circuit CH controls the switching unit SWH. The control circuit CL controls the switching unit SWL. FIG. 1 shows only a configuration of a V phase of the power semiconductor device 101. In each of a U phase, the V phase, and a W phase, the switching unit SWH and the switching unit SWL are connected in series.

The switching unit SWH and the switching unit SWL have the same configuration, so that only a configuration of the switching unit SWH will be described below. The switching unit SWH includes a first switching element SW1 and a second switching element SW2. The first switching element SW1 and the second switching element SW2 are connected in parallel. The first switching element SW1 has a lower short circuit capability than the second switching element SW2. In the present embodiment, the first switching element SW1 is a SiC-MOSFET, and the second switching element SW2 is a Si-IGBT. The first switching element SW1 has a body diode. A drain electrode of the SiC-MOSFET and a collector electrode of the Si-IGBT are connected to each other, and a source electrode of the SiC-MOSFET and an emitter electrode of the Si-IGBT are connected to each other. The first switching element SW1 is not limited to the SiC-MOSFET, and may be a MOSFET in which a wide bandgap semiconductor other than SiC is used.

The control circuit CH outputs control signals to gate terminals of the first switching element SW1 and the second switching element SW2 of the switching unit SWH based on an input signal VINH input from outside the power semiconductor device 101 to switch on and off the first switching element SW1 and the second switching element SW2 of the switching unit SWH.

The control circuit CH includes a first input circuit 11, a second input circuit 12, a first drive circuit 13, and a second drive circuit 14. The first input circuit 11 receives the input signal VINH, and generates a signal input into the first drive circuit 13. The second input circuit 12 receives the input signal VINH, and generates a signal input into the second drive circuit 14. The first drive circuit 13 receives the signal from the first input circuit 11, and outputs a control signal to a gate terminal of the first switching element SW1 to switch on and off the first switching element SW1. The second drive circuit 14 receives the signal from the second input circuit 12, and outputs a control signal to a gate terminal of the second switching element SW2 to switch on and off the second switching element SW2.

The control circuit CL outputs control signals to gate terminals of the first switching element SW1 and the second switching element SW2 of the switching unit SWL based on an input signal VINL input from outside the power semiconductor device 101, and switches on and off the first switching element SW1 and the second switching element SW2 of the switching unit SWL.

The control circuit CL includes a first determination circuit 25, a second determination circuit 26, a first protection circuit 27, and a second protection circuit 28 in addition to a first input circuit 21, a second input circuit 22, a first drive circuit 23, and a second drive circuit 24. The first input circuit 21, the second input circuit 22, the first drive circuit 23, and the second drive circuit 24 respectively have the same configurations as the first input circuit 11, the second input circuit 12, the first drive circuit 13, and the second drive circuit 14 of the control circuit CH. However, outputs from the first protection circuit 27 and the second protection circuit 28 are respectively input into the first input circuit 21 and the second input circuit 22.

The first determination circuit 25 and the second determination circuit 26 determine whether the switching unit SWL is short circuited, and respectively notify the first protection circuit 27 and the second protection circuit 28. A source electrode of the first switching element SW1 and an emitter electrode of the second switching element SW2 of the switching unit SWL are connected to ground through a resistor Rs. Due to a target current as a current flowing through parallel connection of the first switching element SW1 and the second switching element SW2 in the switching unit SWL, a voltage drop occurs across the resistor Rs. In other words, the resistor Rs converts the target current into a voltage. In Embodiment 1, the target current is the sum of a main current flowing through the first switching element SW1 and a main current flowing through the second switching element SW2. The voltage generated through conversion by the resistor Rs is input into the first determination circuit 25 and the second determination circuit 26 as a voltage signal VCIN.

The first determination circuit 25 includes a comparator 251. A threshold voltage Vref1 is input into a negative terminal of the comparator 251, and the voltage signal VCIN is input into a positive terminal of the comparator 251. The comparator 251 compares the voltage signal VCIN to the threshold voltage Vref1, and outputs a HIGH level signal when the voltage signal VCIN is equal to or greater than the threshold voltage Vref1. The signal is input into an input terminal S of the first protection circuit 27. As described above, the first determination circuit 25 determines that the switching unit SWL is short circuited when the voltage signal VCIN is equal to or greater than the threshold voltage Vref1, and notifies the first protection circuit 27 accordingly. In other words, the first determination circuit 25 determines that the short circuit occurs when the target current is equal to or greater than a first threshold corresponding to the threshold voltage Vref1. In Embodiment 1, the threshold voltage Vref1 is set to be equal to or greater than a value of the voltage drop occurring across the resistor Rs due to the target current corresponding to a rated current of the first switching element SW1.

The second determination circuit 26 includes a comparator 261. A threshold voltage Vref2 is input into a negative terminal of the comparator 261, and the voltage signal VCIN is input into a positive terminal of the comparator 261. The comparator 261 compares the voltage signal VCIN to the threshold voltage Vref2, and outputs a HIGH level signal when the voltage signal VCIN is equal to or greater than the threshold voltage Vref2. The signal is input into an input terminal S of the second protection circuit 28. As described above, the second determination circuit 26 determines that the switching unit SWL is short circuited when the voltage signal VCIN is equal to or greater than the threshold voltage Vref2, and notifies the second protection circuit 28 accordingly. The threshold voltage Vref2 is greater than the threshold voltage Vref1, so that the second determination circuit 26 determines that the short circuit occurs later than the first determination circuit 25. In other words, the second determination circuit 26 determines that the short circuit occurs when the target current is equal to or greater than a second threshold corresponding to the threshold voltage Vref2. In Embodiment 1, the threshold voltage Vref2 is set to be equal to or greater than a value of the voltage drop occurring across the resistor Rs due to the target current corresponding to a rated current of the second switching element SW2.

The first protection circuit 27 includes a filter and a latch circuit 271. The filter is to prevent erroneous determination due to noise. The latch circuit 271 holds determination that the short circuit occurs made by the first determination circuit 25 for a period of time. When the voltage signal VCIN is equal to or greater than the threshold voltage Vref1 even after a certain filter time, the latch circuit 271 outputs a HIGH level signal from an output terminal Q, and notifies the first input circuit 21 that a short circuit current is generated.

The second protection circuit 28 includes a filter and a latch circuit 281. The filter is to prevent erroneous determination due to noise. The latch circuit 281 holds determination that the short circuit occurs made by the second determination circuit 26 for a period of time. When the voltage signal VCIN is equal to or greater than the threshold voltage Vref2 even after a certain filter time, the latch circuit 281 outputs a HIGH level signal from an output terminal Q, and notifies the second input circuit 22 that a short circuit current is generated.

The input signal VINL and the signal output from the latch circuit 271 are input into the first input circuit 21. When the output from the latch circuit 271 is at a LOW level, an output signal VINL1 from the first input circuit 21 is a delayed version of the input signal VINL. When the output from the latch circuit 271 is at a HIGH level, the output signal VINL1 from the first input circuit 21 is at a LOW level regardless of the input signal VINL. When receiving the LOW level input, the first drive circuit 23 outputs a LOW level signal to the gate terminal of the first switching element SW1 of the switching unit SWL. The first switching element SW1 is thereby switched off.

The input signal VINL and the signal output from the latch circuit 281 are input into the second input circuit 22. When the output from the latch circuit 281 is at a LOW level, an output signal VINL2 from the second input circuit 22 is synchronized with the input signal VINL, so that the output signal VINL2 is at a LOW level when the input signal VINL is at a LOW level, and is at a HIGH level when the input signal VINL is at a HIGH level. In the second input circuit 22, a delay of the output signal with respect to the input signal does not occur in contract to the first input circuit 21, or, if the delay occurs, the amount of delay is smaller than that in the first input circuit 21. Thus, when the switching unit SWL is on, the second switching element SW2 is switched on before the first switching element SW1. A flow of an excessive current through the first switching element SW1 having a lower short circuit capability can thereby be prevented.

When the output from the latch circuit 281 is at a HIGH level, the output signal VINL2 from the second input circuit 22 is at a LOW level regardless of the input signal VINL. When receiving the LOW level input, the second drive circuit 24 outputs a LOW level signal to the gate terminal of the second switching element SW2 of the switching unit SWL. The second switching element SW2 is thereby switched off. Since the second determination circuit 26 determines that the short circuit occurs later than the first determination circuit 25 as described above, the second switching element SW2 is switched off later than the first switching element SW1. The flow of the excessive current through the first switching element SW1 having the lower short circuit capability can thereby be prevented.

The HIGH level signals output from the output terminals Q of the latch circuits 271 and 281 are also referred to as short circuit notification signals. Reset signals are input into reset terminals R of the latch circuits 271 and 281 after a period of time from output of the short circuit notification signals. The signals output from the output terminals Q of the latch circuits 271 and 281 thus change from a HIGH level to a LOW level. In other words, the first protection circuit 27 and the second protection circuit 28 cancel determination that the short circuit occurs. The switching unit SWL then returns to normal switching operation.

A-2. Operation

Figure 2:
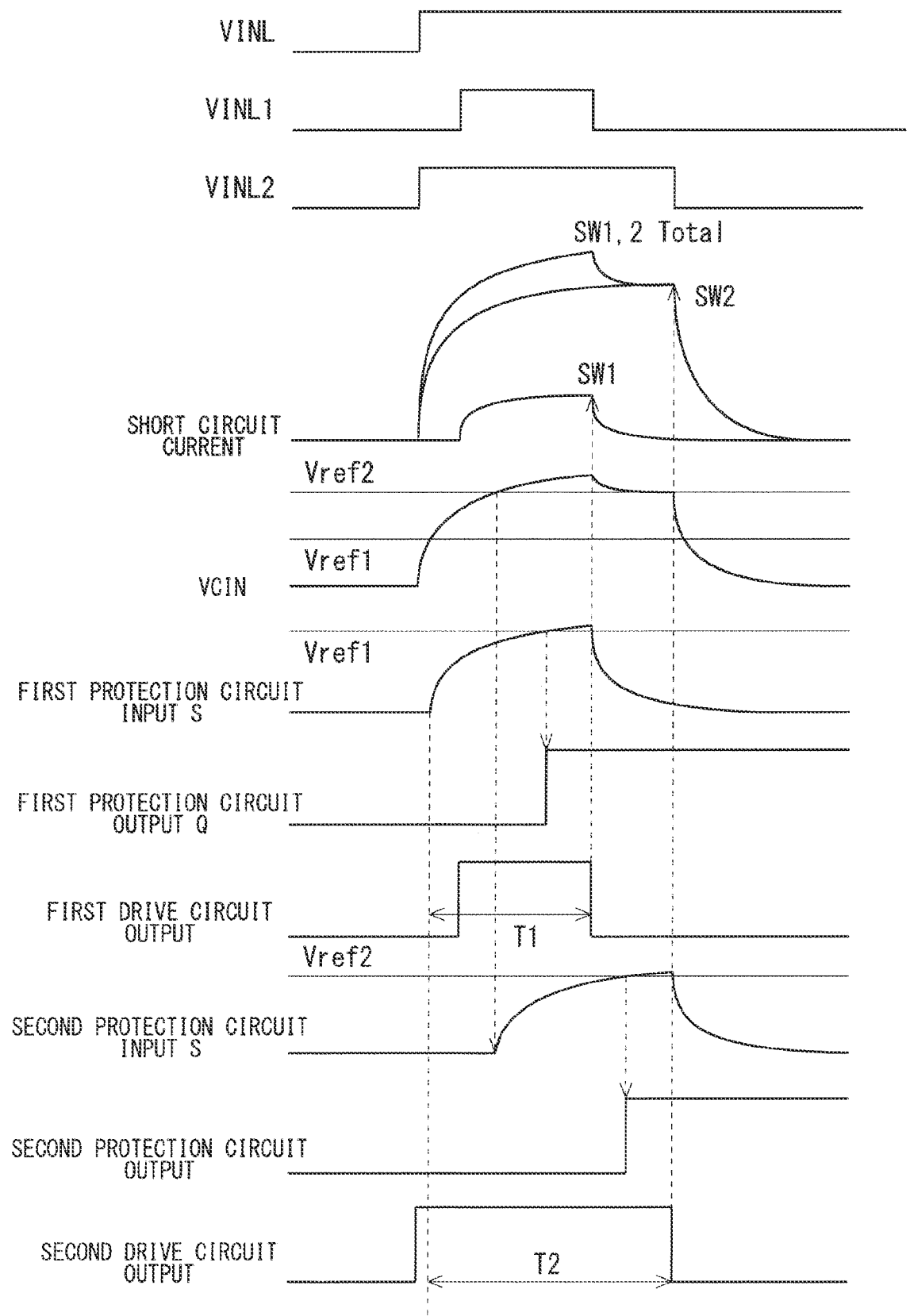
FIG. 2 shows a sequence at short circuit operation of the power semiconductor device in Embodiment 1.
Figure 3:
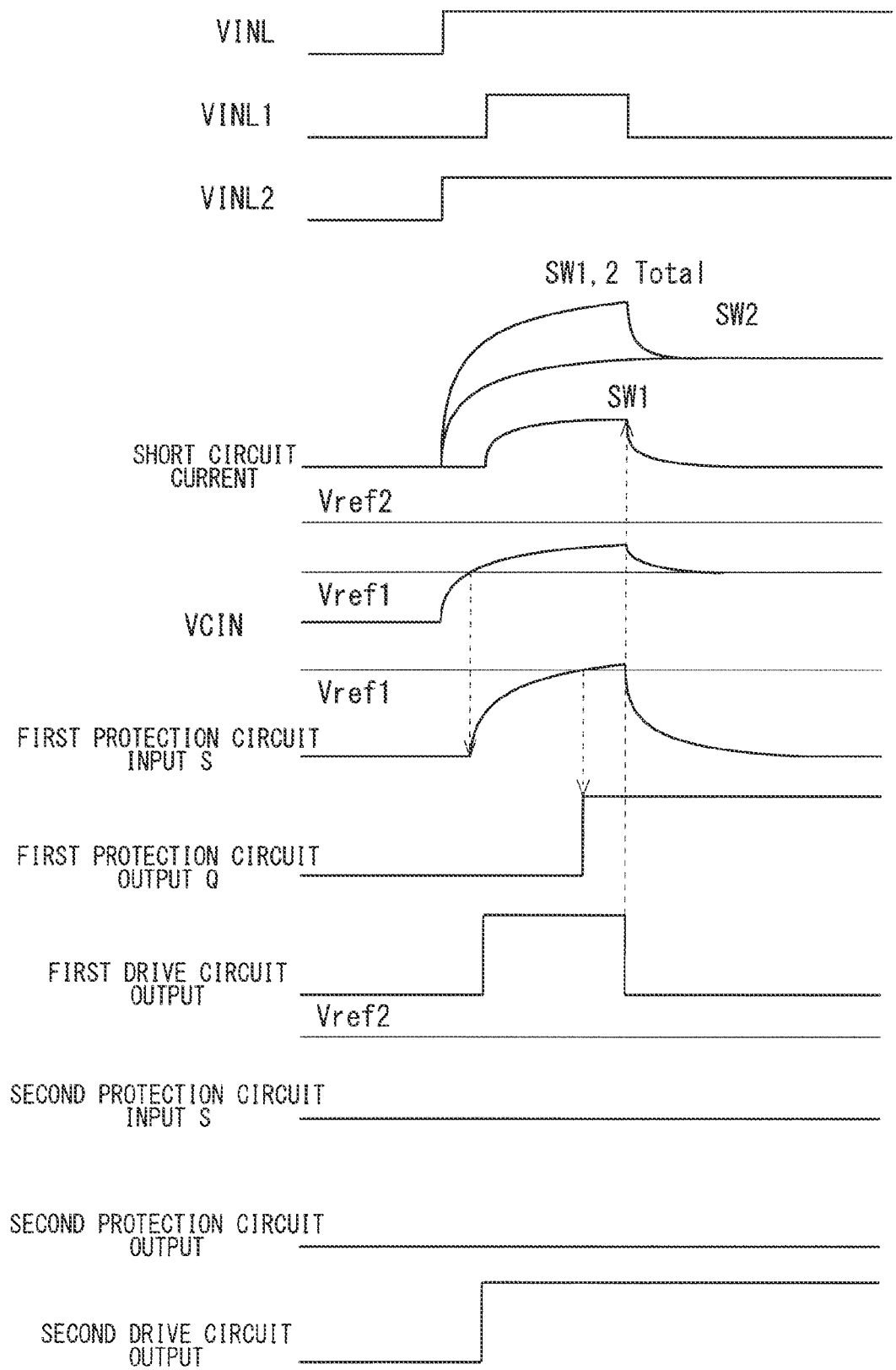
FIG. 3 shows a sequence at short circuit operation of the power semiconductor device in Embodiment 1.

FIGS. 2 and 3 show sequences at short circuit operation of the power semiconductor device 101. FIG. 2 shows a case where the short circuit current is high, and thus the first switching element SW1 and the second switching element SW2 of the switching unit SWL are both switched off.

When short circuit currents are generated in the first switching element SW1 and the second switching element SW2, the sum of a short circuit current generated in the first switching element SW1 and a short circuit current generated in the second switching element SW2 flows through the resistor Rs, and the voltage drop occurs across the resistor Rs. A voltage value corresponding to the voltage drop is input into each of the first determination circuit 25 and the second determination circuit 26 as the voltage signal VCIN. When the voltage signal VCIN is equal to or greater than the threshold voltage Vref1, the first determination circuit 25 outputs the HIGH level signal. When the output from the first determination circuit 25 continues to be at a HIGH level for a period of time, that is, a period of time during which the voltage signal VCIN is equal to or greater than the threshold voltage Vref1 continues for the period of time, the first protection circuit 27 outputs the HIGH level signal, that is, the short circuit notification signal to the first input circuit 21. Thus, the output from the first input circuit 21 becomes at a LOW level, and the output from the first drive circuit 23 becomes at a LOW level. As a result, the first switching element SW1 is switched off.

When the short circuit current then increases so that the voltage signal VCIN is equal to or greater than the threshold voltage Vref2, the second determination circuit 26 outputs the HIGH level signal. When the output from the second determination circuit 26 continues to be at a HIGH level for a period of time, that is, a period of time during which the voltage signal VCIN is equal to or greater than the threshold voltage Vref2 continues for the period of time, the second protection circuit 28 outputs the HIGH level signal, that is, the short circuit notification signal to the second input circuit 22. Thus, the output from the second input circuit 22 becomes at a LOW level, and the output from the second drive circuit 24 becomes at a LOW level. As a result, the second switching element SW2 is switched off. A time T1 from generation of the short circuit current until the first switching element SW1 is switched off is herein shorter than a time T2 from generation of the short circuit current until the second switching element SW2 is switched off.

FIG. 3 shows a case where the short circuit current is lower than that in the example of FIG. 2, and only the first switching element SW1 of the switching unit SWL is switched off. When an equation Vref1<VCIN<Vref2 is satisfied, the power semiconductor device 101 switches off only the first switching element SW1, and allows a current to flow through only the second switching element SW2.

A-3. Effects

The power semiconductor device 101 in Embodiment 1 includes: the first switching element SW1; the second switching element SW2 connected in parallel to the first switching element SW1, and having a higher short circuit capability than the first switching element SW1; the drive circuits 23 and 24 to drive the first switching element SW1 and the second switching element SW2; and the determination circuits 25 and 26 to compare the target current as the sum of the current flowing through the first switching element SW1 and the current flowing through the second switching element SW2 to the first threshold and the second threshold greater than the first threshold, and the drive circuits 23 and 24 switch off the first switching element SW1 when the determination circuits 25 and 26 determine that the target current is equal to or greater than the first threshold, and switches off the second switching element SW2 when the determination circuits 25 and 26 determine that the target current is equal to or greater than the second threshold. According to the power semiconductor device 101, by properly setting the first threshold and the second threshold used by the determination circuits 25 and 26, only the first switching element SW1 can be shut down when the short circuit current flows. As a result, the short circuit capability of the power semiconductor device 101 as a whole can be determined by the second switching element SW2 while destruction of the first switching element SW1 having a lower short circuit capability is prevented. As a result, the short circuit capability of the power semiconductor device 101 as a whole can easily be designed to be high.

B. Embodiment 2

B-1. Configuration

Figure 4:
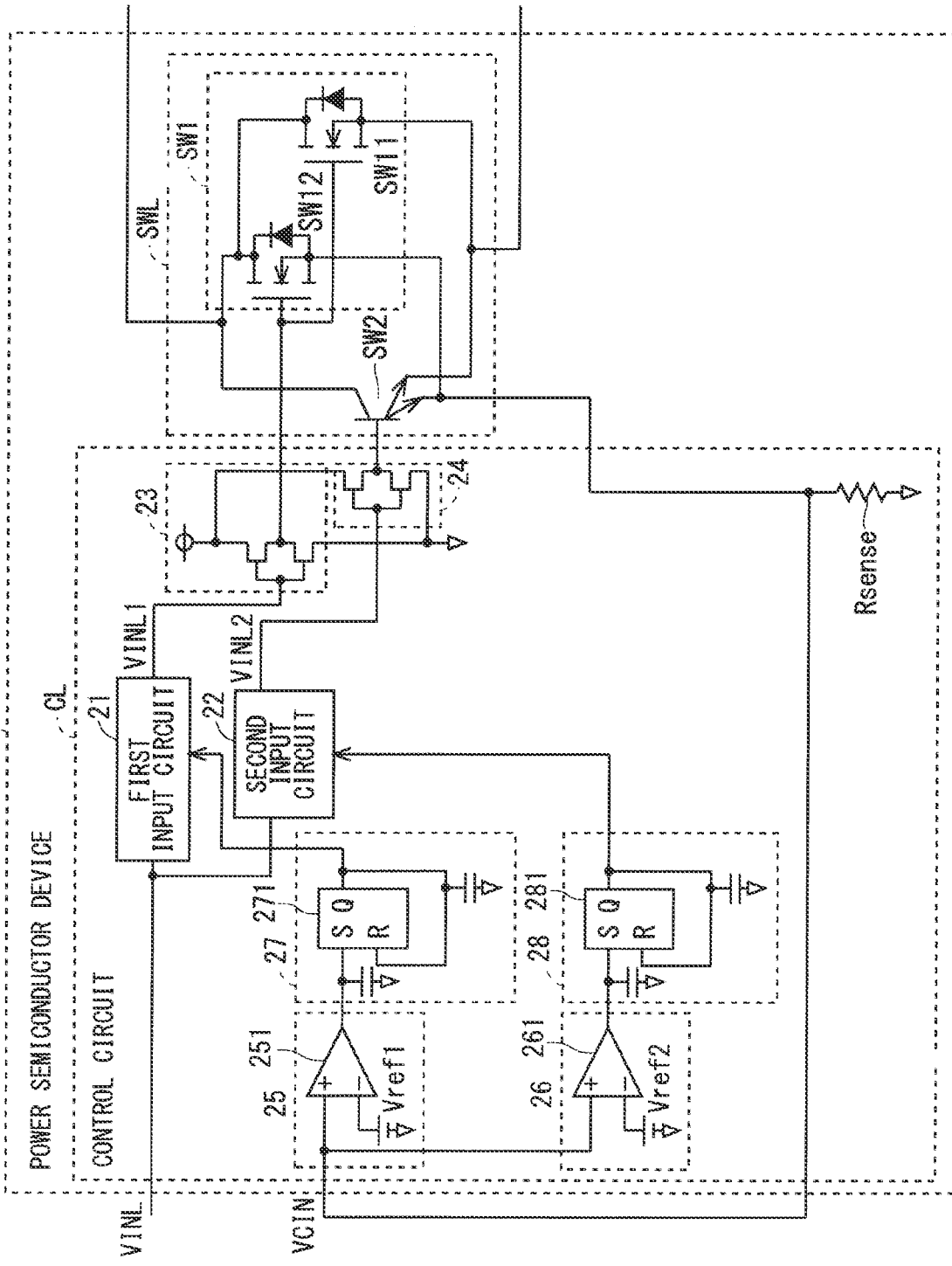
FIG. 4 shows a configuration of a power semiconductor device in Embodiment 2.

FIG. 4 shows a configuration of a power semiconductor device 102 in Embodiment 2. While the power semiconductor device 102 includes the switching units SWH and SWL and the control circuits CH and CL as with the power semiconductor device 101 in Embodiment 1, only a configuration of the switching unit SWL and the control circuit CL relating to the lower arm is shown in FIG. 4. A configuration of the switching unit SWH and the control circuit CH relating to the upper arm of the power semiconductor device 102 is similar to that of the power semiconductor device 101.

In the switching unit SWL of the power semiconductor device 102, the first switching element SW1 is divided into a main cell SW11 and a sense cell SW12. A value of the sum of a current flowing through the sense cell SW12 and a sense current flowing through the second switching element SW2 is converted into a voltage value by a resistor Rsense, and the voltage value becomes the voltage signal VCIN. The power semiconductor device 102 is otherwise similar to the power semiconductor device 101 in Embodiment 1.

B-2. Effects

That is to say, in the power semiconductor device 102 in Embodiment 2, the target current on which the voltage signal VCIN used for determination made by the determination circuits 25 and 26 is based is the sum of a sense current flowing through the first switching element SW1 and a sense current flowing through the second switching element SW2. The power semiconductor device 102 can thus generate the voltage signal VCIN within the power semiconductor device 102 itself. Thus, according to the power semiconductor device 102, an effect of reducing the number of external input terminals can be obtained in addition to the effects obtained by the power semiconductor device 101 in Embodiment 1.

C. Embodiment 3

C-1. Configuration

A power semiconductor device in Embodiment 3 has a similar configuration to the power semiconductor device 101 in Embodiment 1 shown in FIG. 1 or the power semiconductor device 102 in Embodiment 2 shown in FIG. 4. In Embodiments 1 and 2, the first switching element SW1 is preferentially switched off when the excessive current, such as the short circuit current, flows through the parallel connection of the first switching element SW1 and the second switching element SW2 in the switching unit SWL. The operation of preferentially switching off the first switching element SW1 is effective not only in a case where the excessive current flows but also at normal switching operation of the power semiconductor device. In Embodiment 3, the threshold voltage Vref1 used by the first determination circuit 25 is set in a region of not short circuit operation but normal operation of the switching unit SWL.

Figure 5:
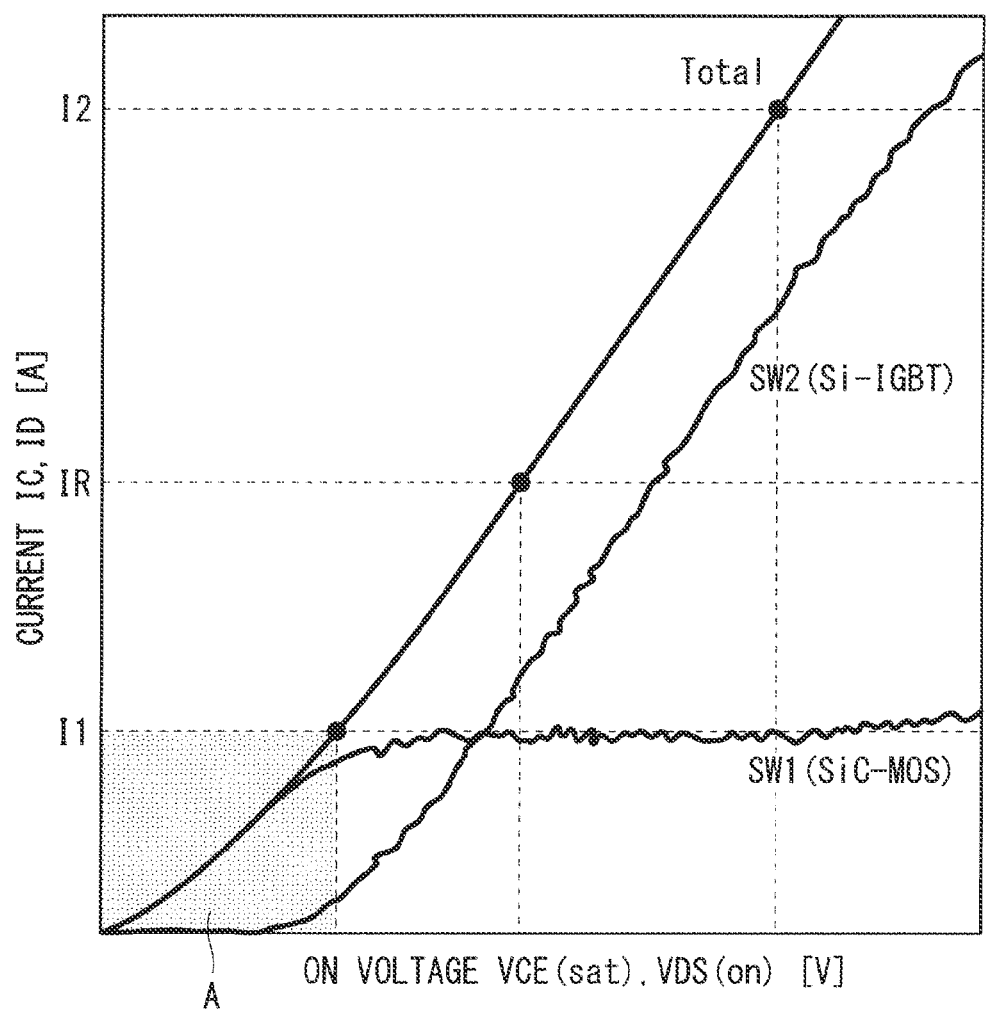
FIG. 5 shows a relationship between currents flowing through switching elements and on voltages.

FIG. 5 shows a relationship between currents flowing through the first switching element SW1 and the second switching element SW2 and on voltages. The on voltages include a drain-to-source on voltage VDS(on) in the first switching element SW1 and a collector-to-emitter saturation voltage VCE(sat) in the second switching element SW2. In FIG. 5, IR represents a rated current of the first switching element SW1, I1 is a predetermined current value smaller than the rated current IR, and I2 is twice the rated current IR.

In FIG. 5, a region in which the drain-to-source on voltage VDS(on) in the first switching element SW1 is smaller than the collector-to-emitter saturation voltage VCE(sat) in the second switching element SW2 for the same current is set to a low current region A, and an upper current limit in the low current region A is set to I1. In the low current region A, an on resistance of the MOSFET is lower than an on resistance of the IGBT, so that more current flows through the MOSFET than through the IGBT.

On the other hand, a region in which the drain-to-source on voltage VDS(on) in the first switching element SW1 is greater than the collector-to-emitter saturation voltage VCE (sat) in the second switching element SW2 for the same current is referred to as a high current region. The low current region A contributes the most to improvement in loss under usage operating condition of the power semiconductor device. Thus, when the first switching element SW1 is a wide bandgap element, such as a SiC-MOSFET, having a low on resistance, loss of the power semiconductor device can be improved by allowing more current to flow through the first switching element SW1 in the low current region A.

In the high current region, more current flows through the Si-IGBT as the second switching element SW2, so that the effect of improving loss obtained by using a wide bandgap semiconductor for the first switching element SW1 is small.

Thus, in Embodiment 3, the threshold voltage Vref1 used by the first determination circuit 25 is set to a value corresponding to the upper current limit I1. That is to say, when the configuration in Embodiment 1 is used in Embodiment 3, an equation Vref1=I1×Rs is satisfied. When the configuration in Embodiment 2 is used in Embodiment 3, an equation Vref1=I1×Rsense is satisfied. Control is thus performed so that the SiC-MOSFET as the first switching element is not actively switched on in the high current region not distributing to improvement in loss. As a result, excessive current capability of a device having a low short circuit capability can be improved.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
   a first switching element;
   a second switching element directly connected in parallel to the first switching element, and having a higher short circuit capability than the first switching element;
   a drive circuit to drive the first switching element and the second switching element; and
   a determination circuit to compare a target current to a first threshold and a second threshold greater than the first threshold, the target current being a sum of a current flowing through the first switching element and a current flowing through the second switching element, wherein
   the drive circuit switches off the first switching element when the determination circuit determines that the target current is equal to or greater than the first threshold, and switches off the second switching element when the determination circuit determines that the target current is equal to or greater than the second threshold.

2. The power semiconductor device according to claim 1, wherein
   the target current is a sum of a main current flowing through the first switching element and a main current flowing through the second switching element.

3. The power semiconductor device according to claim 1, wherein
   the target current is a sum of a sense current flowing through the first switching element and a sense current flowing through the second switching element.

4. The power semiconductor device according to claim 1, wherein
   the determination circuit comprises a first determination circuit to compare the target current to the first threshold and a second determination circuit to compare the target current to the second threshold.

5. The power semiconductor device according to claim 1, wherein a wide bandgap semiconductor is used as a semiconductor material for the first switching element.

* * * * *